(12) United States Patent
Park et al.

(10) Patent No.: US 9,711,569 B2
(45) Date of Patent: Jul. 18, 2017

(54) IMAGE SENSOR AND METHOD FOR DRIVING SAME

(71) Applicant: IUCF-HYU, Seoul (KR)

(72) Inventors: Jea-Gun Park, Seongnam-Si (KR); Seung-Hyun Song, Seoul (KR); Ji-Heon Kim, Ulsan (KR); Dal-Ho Kim, Yeosu-Si (KR)

(73) Assignee: IUCF-HYU (KR)

( * ) Notice: Subject to any disclaimer, the term of this patent is extended or adjusted under 35 U.S.C. 154(b) by 181 days.

(21) Appl. No.: 14/403,573

(22) PCT Filed: May 21, 2013

(86) PCT No.: PCT/KR2013/004432
§ 371 (c)(1),
(2) Date: Nov. 24, 2014

(87) PCT Pub. No.: WO2013/176456
PCT Pub. Date: Nov. 28, 2013

(65) Prior Publication Data
US 2015/0171145 A1 Jun. 18, 2015

(30) Foreign Application Priority Data
May 24, 2012 (KR) .................. 10-2012-0055491

(51) Int. Cl.
*H01L 27/00* (2006.01)
*H01L 27/30* (2006.01)
(Continued)

(52) U.S. Cl.
CPC ...... *H01L 27/307* (2013.01); *H01L 27/14621* (2013.01); *H01L 27/14629* (2013.01); *H01L 51/44* (2013.01); *H04N 5/3696* (2013.01)

(58) Field of Classification Search
CPC ......... H01L 27/14601; H01L 27/14603; H01L 27/14607; H01L 29/7869
(Continued)

(56) References Cited

U.S. PATENT DOCUMENTS

| 4,318,115 A | 3/1982 | Yoshikawa et al. |
| 2005/0206767 A1 | 9/2005 | Suzuki |

(Continued)

FOREIGN PATENT DOCUMENTS

| CN | 1943041 A | 4/2007 |
| CN | 1965572 A | 5/2007 |

(Continued)

OTHER PUBLICATIONS

International Search Report & Written Opinion for PCT/KR2013/004432, mailed Sep. 30, 2013.

*Primary Examiner* — Kevin Pyo

(57) ABSTRACT

An image sensor and an operating method thereof are disclosed. The image sensor includes a first photoelectric conversion portion configured to receive plural lights, except for a light of first wavelength, to generate an electric charge; and a second photoelectric conversion portion configured to receive the light of the first wavelength to generate an electric charge, wherein at least a portion of the first photoelectric conversion portion and the second photoelectric conversion portion is spaced apart from each other in a vertical direction.

16 Claims, 4 Drawing Sheets

(51) Int. Cl.
*H01L 27/146* (2006.01)
*H04N 5/369* (2011.01)
*H01L 51/44* (2006.01)

(58) Field of Classification Search
USPC ............ 250/208.1, 214.1; 257/431, 435, 448
See application file for complete search history.

(56) References Cited

U.S. PATENT DOCUMENTS

| | | |
|---|---|---|
| 2006/0197169 A1 | 9/2006 | Cole |
| 2007/0084986 A1 | 4/2007 | Yang et al. |
| 2007/0090274 A1 | 4/2007 | Lee et al. |
| 2008/0117319 A1 | 5/2008 | Jiang et al. |
| 2008/0135963 A1 | 6/2008 | Akiyama |
| 2012/0001286 A1 | 1/2012 | Yoon |
| 2016/0163870 A1* | 6/2016 | Ito ................. H01L 29/7869 257/43 |
| 2016/0218219 A1* | 7/2016 | Asami ............ H01L 29/7869 |

FOREIGN PATENT DOCUMENTS

| | | |
|---|---|---|
| CN | 102196195 A | 9/2011 |
| EP | 1006585 A1 | 6/2000 |
| JP | 2005268476 A | 9/2005 |
| JP | 2006140249 A | 6/2006 |
| JP | 2006203457 A | 8/2006 |
| KR | 100882469 B1 | 2/2009 |

\* cited by examiner

IMAGE SENSOR AND METHOD FOR DRIVING SAME

TECHNICAL FIELD

The present invention relates to an image sensor and an operating method thereof, and more specifically, to a CMOS (Complementary Metal Oxide Silicon) image sensor and an operating method thereof.

BACKGROUND

A CMOS image sensor includes a plurality of pixels each having a photoelectric conversion element for converting an incident light into an electric signal, and an MOS transistor for reading the electric signal from each pixel. The CMOS sensor has advantages of low voltage and low power consumption, and thus a use range thereof is widened to a camera for a cell phone, a digital still camera, a digital video camera, or the like.

The CMOS image sensor includes a photodiode formed in a substrate as a photoelectric conversion element, a dielectric layer with a plurality of wiring layers formed thereon, and a color filter and a micro lens which are formed on the dielectric layer. In this instance, the color filter has a red color filter, a green color filter, and a blue color filter, which are formed for every pixel and are formed vertically to correspond to each photodiode. Therefore, for example, red light passes through the red color filter, and the photodiode below the red color filter generates and stores an electric charge in accordance with a quantity of light. Further, the electric charge generated by the photodiode flows in a floating diffusion region through a transfer transistor in which an electric signal is stored.

However, as the image sensor is reduced in size while the number of pixels is increased, the pixel is reduced in size. The reduction in size of the pixel causes an interval between the wiring layers to be shortened. If the interval between the wiring layers is shortened, there is a crosstalk phenomenon in which the light supplied from the color filter to the photodiode collides against the wiring layers and thus is scattered. Occurrence of the crosstalk phenomenon leads to reduction in quantity of the light supplied to the photodiode. Accordingly, the amount of the electric charges generated by the photodiode is also decreased. As a result, there is a problem in that the sensitivity of the image sensor is decreased, and a color intensity characteristic is deteriorated.

SUMMARY

Problems to be Solved

It is an object of the present invention to provide an image sensor capable of preventing occurrence of crosstalk even though a size of a pixel is reduced, and thus preventing the decrease in color sensitivity and color clarity, and an operating method thereof.

It is another object of the present invention to provide an image sensor capable of increasing the number of pixels in the same area, and an operating method thereof.

Means to Solve the Problems

According to one aspect of the present invention, an image sensor includes a first photoelectric conversion portion configured to receive plural lights, except for a light of first wavelength, to generate an electric charge; and a second photoelectric conversion portion configured to receive the light of the first wavelength to generate an electric charge, wherein at least a portion of the first photoelectric conversion portion and the second photoelectric conversion portion is spaced apart from each other in a vertical direction.

The first photoelectric conversion portion is provided in a predetermined region in a substrate.

The image sensor further includes a plurality of first read-out elements provided on the substrate in such a way that the first read-out elements are spaced apart from the first photoelectric conversion portion.

The image sensor further includes a light transmission portion formed on the first photoelectric conversion portion, a dielectric layer formed on the plurality of first read-out elements, and a color filter formed on the light transmission portion and the dielectric layer.

The color filter is configured so that at least two color filters each receiving light of different wavelength are alternatively disposed.

The second photoelectric conversion portion includes a charge storing portion provided in the substrate to be spaced apart from the first photoelectric conversion portion and the plurality of first read-out elements at a predetermined interval, an organic light receiving portion formed on the substrate to be spaced apart from the charge storing portion in the vertical direction, and a contact formed between the charge storing portion and the organic light receiving portion to connect the charge storing portion and the organic light receiving portion.

The image sensor further includes a plurality of second read-out elements provided on the substrate to be spaced apart from the charge storing portion at a predetermined interval.

The dielectric layer and the color filter are provided between the organic light receiving portion and the substrate provided with the charge storing portion and the second read-out elements, and the contact is formed in the predetermined region of the color filter and the dielectric layer.

The organic light receiving portion is formed by layering a first transparent electrode, an organic layer and a second transparent electrode.

The organic light receiving portion receives the light of the first wavelength to generate an electric charge, and the charge storing portion stores the electric charge via the contact.

According to another aspect of the present invention, an image sensor includes a plurality of pixels each provided with a first photoelectric conversion portion receiving light, except for a light of first wavelength, to generate an electric charge, and a read-out portion reading the electric charge; and a second photoelectric conversion portion configured to receive the light of the first wavelength to generate an electric charge, wherein the second photoelectric conversion portion includes a charge storing portion provided between at least two pixels, and an organic light receiving portion connected to the charge storing portion and provided on an entire upper portion thereof including the plurality of pixels.

The pixel includes a substrate provided with the first photoelectric conversion portion and a plurality of first read-out elements spaced apart from the first photoelectric conversion portion, a light transmission portion formed on the first photoelectric conversion portion, a dielectric layer formed on the first read-out element between the light transmission portions, and a color filter formed on the light transmission portion and the dielectric layer.

The second photoelectric conversion portion includes a charge storing portion provided in the substrate to be spaced apart from the first photoelectric conversion portion, a plurality of second read-out elements provided on the substrate to be spaced apart from the charge storing portion, a contact formed in the dielectric layer and the color filter which are layered on the substrate, and connected to the charge storing portion, and an organic light receiving portion formed on the color filter and connected to the contact.

The organic light receiving portion includes a first transparent electrode, an organic layer and a second transparent electrode, which are layered on the color filter.

The first transparent electrode is applied by a voltage of higher potential than that applied to the second transparent electrode, so that exciton generated by the organic layer is separated into an electron and a hole.

According to further another aspect of the present invention, a method of operating an image sensor includes the steps of: applying a voltage of first potential to a first transparent electrode of a second photoelectric conversion portion, and applying a voltage of second potential lower than the first potential to a second transparent electrode; floating the first transparent electrode so that the first transparent electrode maintains the first potential; receiving a light of a first wavelength to generate an electric charge and store it in a charge storing portion; transferring the electric charge stored in the charge storing portion to a charge detecting portion; and sensing and output a potential of the charge detecting portion.

The method further includes resetting the charge detecting portion before the electric charge stored in the charge storing portion is transferred to the charge detecting portion.

Effects of the Invention

According to embodiments of the present invention, the image sensor includes the first photoelectric conversion portion for generating the electric charge according to the plural lights, except for the light of the first wavelength, passing through the color filter, and the second photoelectric conversion portion absorbing the light of the first wavelength to generate the electric charge, the first and second photoelectric conversion portion being spaced apart from each other in the vertical direction.

Therefore, the number of the pixels can be increased in the same area, as compared with the related art in which all photoelectric conversion portions absorbing the lights of all colors incident thereon to generate the electric charge are formed in the substrate. Therefore, a degree of integration can be improved. For example, the related art is required for two pixels for the green light, one pixel for the red light, and one pixel for the blue light, for unit area to achieve the green, the red and the blue, but the present invention is required for two pixels to achieve these colors. Therefore, it is possible to increase an area margin of about 100%.

Further, in the related art, a size of the pixel is decreased to increase the degree of integration, and thus an interval between the wiring layers is also narrowed, so that crosstalk occurs. However, since the present invention has the area margin of about 100%, as compared with the related art, it is possible to secure the interval between the wiring layers, so that the crosstalk does not occur.

DETAILED DESCRIPTION OF THE INVENTION

Figure 1:
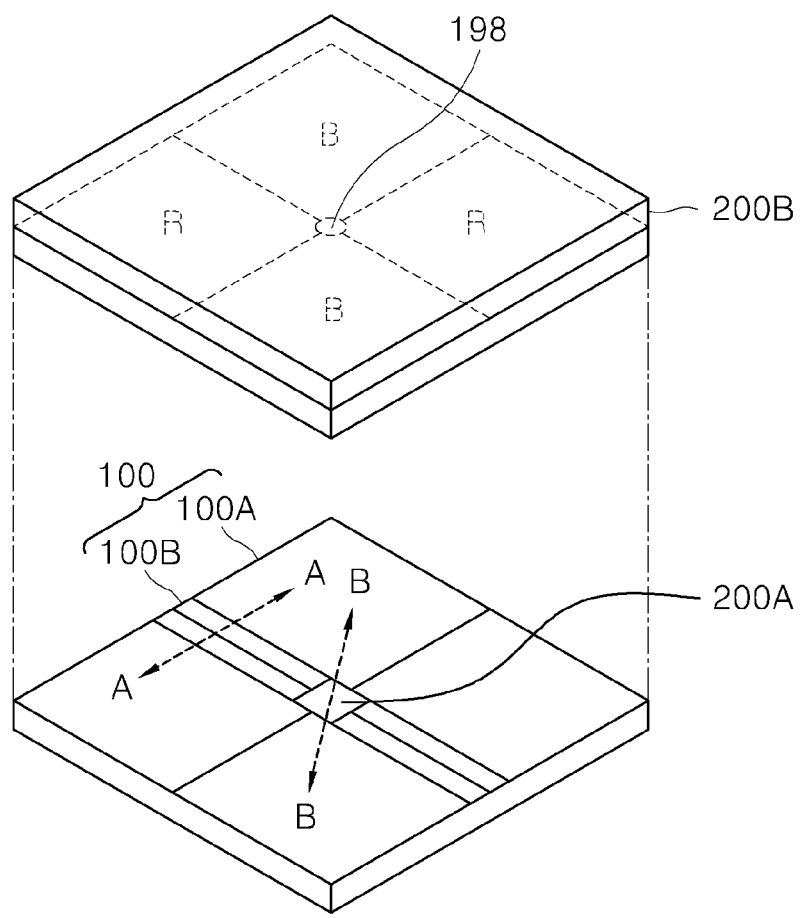
FIG. 1 is a perspective view of an image sensor according to an embodiment of the present invention.

Now, embodiments according to the present invention will be described in detail with reference to the accompanying drawings. However, the present invention is not limited to these embodiments, but may be practiced as various different configurations. These embodiments are provided for a full understanding of the present invention, and the scope of the present invention may be fully understood by one with ordinary skill in the art with reference to these embodiments. In the drawings, like numbers represent like elements.

Figure 2:
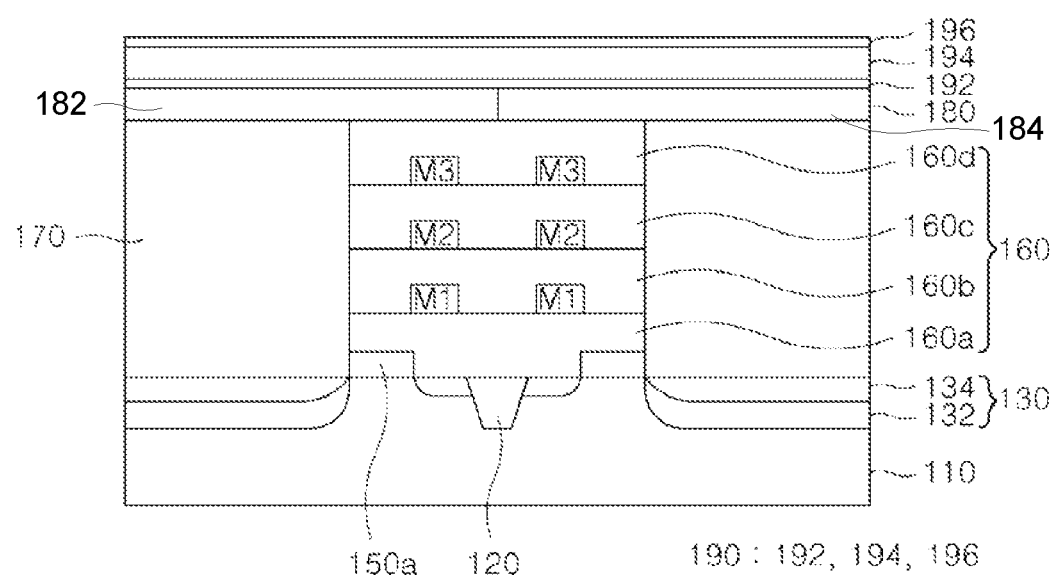
FIGS. 2 and 3 are cross-sectional views of the image sensor according to the embodiment of the present invention.

FIG. 1 is a perspective view illustrating an upper portion and a lower portion of an image sensor according to an embodiment of the present invention. FIG. 2 is a cross-sectional view taken along the line A-A in FIG. 1, and FIG. 3 is a cross-sectional view taken along the line B-B in FIG. 1.

Referring to FIG. 1, the image sensor according an embodiment of the present invention includes a plurality of pixels 100 having a first photoelectric conversion portion 100A and a read-out portion 100B, and a second photoelectric conversion portion 200 with a portion thereof interposed between at least two pixels 100 and the remaining portion provided on the plurality of pixels 100. The first photoelectric conversion portion 100A generates and stores an electric charge in accordance with a quantity of incident light of plural wavelengths, except for a light of first wavelength. For example, the first photoelectric conversion portion 100A generates an electric charge according to red or blue light incident on color filters R and B, except for green light. The read-out portion 100B may have a floating diffusion region and a plurality of first read-out elements to read the electric charge generated by the first photoelectric conversion portion 100A. The plurality of first read-out elements may have a charge transfer element, a selection element, an amplifying element, and a reset element. Further, the second photoelectric conversion portion 200 absorbs the light of first wavelength to generate and store an electric charge in accordance with a quantity of the light. For example, the second photoelectric conversion portion 200 absorbs the green light to generate and store the electric charge in accordance with the quantity of the light. The second photoelectric conversion portion 200 may include an organic light receiving portion 200B for absorbing the light of the first wavelength to generate the electric charge in accordance with the quantity of the light, a charge storing portion 200A for storing the electric charge generated by the organic light receiving portion 200B, and a floating diffusion region and a plurality of second read-out elements (not illustrated) to read the electric charge stored in the charge storing portion 200A. The second photoelectric conversion portion 200 is provided in separated lower and upper portions in such a way that a portion is interposed between at least two pixels 100 and the remaining portion is provided on the entire including the plurality of pixels 100. For example, the charge storing portion 200A, the floating diffusion region and the second read-out element may be interposed between at least two lower pixels 100, while the organic light receiving portion 200B may be provided on the upper color filters R and B. In this instance, since the charge storing portion 200A, the floating diffusion region and the plurality of second read-out elements are formed on a portion of the read-out portion 100B of the pixel 100, an area of the first photoelectric conversion portion 100A is not decreased.

The structure of the image sensor according to the embodiment of the present invention will now be described in detail with reference to FIGS. 2 and 3.

Figure 3:
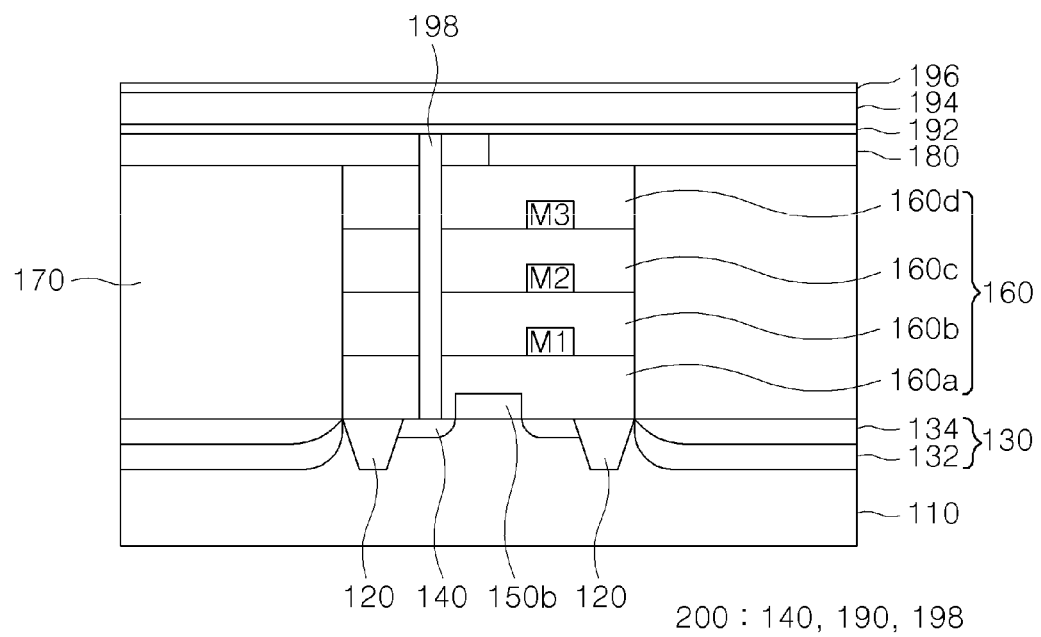

Referring to FIGS. 2 and 3, the image sensor according to the embodiment of the present invention includes a substrate 110, an element isolation region 120 formed in a predetermined region of the substrate 110 to define a plurality of regions, a plurality of first photoelectric conversion portions 130 formed in a predetermined region of the substrate 110, a charge storing portion 140 formed in a predetermined region of the substrate 110, read-out elements 150a and 150b formed in a predetermined region on the substrate 110, a dielectric layer 160 formed on the substrate 110, with a plurality of wiring layers M1, M2 and M3 formed thereon, a light transmission portion 170 with the dielectric layer 160 interposed therebetween, a color filter 180 formed on the dielectric layer 160 and the light transmission portion 170, and an organic light receiving portion 190 formed on the color filter 180.

As the substrate 110, a first conductive type, for example, a p-type substrate, may be used. Although not illustrated, an epitaxial layer may be formed on the substrate 110, or a plurality of wells may be formed in the substrate 110. For example, as the substrate 110, an SOI (Silicon on Insulator) substrate including a lower silicon substrate, a buried insulating layer formed on the lower silicon substrate, and a silicon semiconductor layer formed on the buried insulating layer may be used.

The substrate 110 is provided with the element isolation region 120 formed in a predetermined region, and an active region is defined by the element isolation region 120. The element isolation region 120 may be formed by a LOCOS (LOCal Oxidation of Silicon) method or an STI (Shallow Trench Isolation) method, and may be formed in a predetermined depth in the substrate 110. As illustrated in FIG. 1, the plurality of pixels 100 may be defined by the element isolation region 120. Further, the element isolation region 120 can determine the first photoelectric conversion portion 100A and the read-out portion 100B in the pixel 100. That is, the plurality of pixels 100 may include the first photoelectric conversion portion 100A and the read-out portion 100B, respectively. Further, the element isolation region 120 may define the second lower photoelectric conversion region so as to be provided in a region between at least two pixels 100.

The plurality of first photoelectric conversion portions 130 are formed in the predetermined region in the substrate 110. Specifically, the plurality of first photoelectric conversion portions 130 are formed in at least a portion of the first photoelectric conversion portion 100A of the pixel 100, and is preferably formed in the entire region of the first photoelectric conversion portion 100A in order to increase optical transmittance. The first photoelectric conversion portions 130 generate and store the electric charge corresponding to the quantity of the colored light incident on the color filter 180. In this instance, although will be described later, the color filter 180 allows the first light, for example, plural lights except for green light, i.e., red light and blue light, to transmit. Accordingly, the first photoelectric conversion portions 130 absorb the light, such as red color and blue color, and generate and store the electric charge in accordance to the quantity of the light. The first photoelectric conversion portion 130 includes a photo transistor, a photo gate, a photodiode, a pinned photodiode, and a combination thereof. In the embodiment of the present invention, a photodiode is used as the first photoelectric conversion portions 130, and includes an n$^+$ region (132) formed in the substrate 110, and a p$^+$ region 134 formed in the n$^+$ region 132. That is, the photodiode serving as the first photoelectric conversion portion 130 may be formed in a pnp junction structure.

The charge storing portion 140 is formed in the predetermined region in the substrate 110 to be spaced apart from the first photoelectric conversion portion 130 at a predetermined interval. The charge storing portion 140 is electrically connected to the organic light receiving portion 190 to store the electric charge generated by the organic light receiving portion 190. Herein, the charge storing portion 140 may be formed in the n+ region in the substrate 110. That is, the charge storing portion 140 may be formed in a structure different from the first photoelectric conversion portion 130. The first photoelectric conversion portion 130 absorbs the light to generate and store the electric charge, but the charge storing portion 140 stores the electric charge generated by the second photoelectric conversion portion 200.

The read-out elements 150a and 150b are formed in the predetermined region on the substrate 110. Specifically, the read-out element 150a is formed in the read-out portion 100B of the pixel 100, and the read-out element 150b is formed in the second photoelectric conversion portion 200. The read-out elements 150a and 150b may include a charge transfer element, a selection element, a drive element, and a reset element. Further, the read-out elements 150a and 150b may be formed in a transistor structure. Specifically, the read-out elements 150a and 150b may have a junction region formed in the substrate 110 at one side of a gate electrode. In this instance, FIGS. 2 and 3 show a charge transfer transistor functioning as the read-out elements 150a and 150b, and the charge transfer transistor is formed in such a way that the first photoelectric conversion portion 130 is provided at one side of the gate electrode and the junction region is provided at the other side. Accordingly, the read-out element 150a transfers the electric charge stored in the first photoelectric conversion portion 130. Further, the read-out element 150b is formed in such a way that the charge storing portion 140 is provided at one side of the gate electrode and the junction region is provided at the other side. Accordingly, the read-out element 150b can supply a predetermined voltage to the second photoelectric conversion portion 200 via the charge storing portion 140.

The dielectric layer 160 is formed on the substrate 110, and may be formed in a region, through which the light is not transmitted, on the substrate 110. Specifically, the dielectric layer 160 may be formed in the read-out portion 100B and the second photoelectric conversion portion 200 on the substrate 110. The dielectric layer 160 is formed by layering a plurality of dielectric films, and a plurality of wiring may be formed between the plurality of dielectric films. For example, the dielectric layer 160 may have a first dielectric film 160a, a first wiring M1 formed in a predetermined region on the first dielectric film 160a, a second dielectric film 160b formed on the first dielectric film 160a and the first wiring M1, a second wiring M2 formed in a predetermined region on the second dielectric film 160b, a third dielectric film 160c formed on the second dielectric film 160b and the second wiring M2, a third wiring M3 formed in a predetermined region on the third dielectric film 160c, and a fourth dielectric film 160d formed on the third dielectric film 160c and the third wiring M3. Further, the wirings M1, M2 and M3 can be connected to each other, and, in this instance, the dielectric layer 160 may be formed with a contact for connecting the wirings M1, M2 and M3. Herein, the dielectric layer 160 may be formed of at least one of a silicon nitride film and a silicon oxide film, and the wirings M1, M2 and M3 may be formed of a conductive substance, as well as metal. Meanwhile, the wirings M1, M2 and M3 may be formed to be superimposed on the element isolation region 120 which is a boundary of a unit pixel, or may be formed in the read-out portion 100B. Further, although the case where the wirings M1, M2 and M3 are respectively formed on the dielectric films 160a, 160b and 160c has been described in this embodiment, the wirings M1, M2 and M3 may be formed in the respective dielectric films 160a, 160b and 160c, for example, by damascene interconnection.

Meanwhile, if the dielectric layer 160 is formed of a substance having a low optical transmittance, the incident light is interrupted from reaching the first photoelectric conversion portion 130. Accordingly, the light transmission portion 170 may be formed in a predetermined region of the dielectric layer 160 so as to increase the sensitivity of the image sensor. That is, the light transmission portion 170 may be formed in a region corresponding to the first photoelectric conversion portion 130. To this end, the dielectric layer 160 in the region superposed on the first photoelectric conversion portion 130 is removed to form a cavity, and then the cavity is filled with a light transmission substance to form the light transmission portion 170. The light transmission portion 170 is made of an organic polymer compound, and, for example, may be made of a fluoropolymer having an amorphous structure or a PMMA-based polymer. Further, the light transmission portion 170 may be made of polysiloxane resin, or polysiloxane resin and titanium oxide. Meanwhile, the light transmission portion 170 may be formed by removing a portion of the first dielectric film 160a. However, the present invention is not limited thereto, and, for example, the light transmission portion 170 may be formed in such a way that it is exposed by removing the entire first dielectric film 160a. Alternatively, the light transmission portion 170 may be formed in the dielectric layer 160, except for the first dielectric film 160a. Further, the light transmission portion 170 may be formed to have an inclined side wall and a flat bottom surface, or to have a vertical side wall and a concave or convex bottom surface.

The color filter 180 is formed on the dielectric layer 160 and the light transmission portion 170. A planarization film (not illustrated) may be formed on any one of the upper and lower sides of the color filter 180. The color filter 180 can allow the light of plural wavelengths, except for the light of the first wavelength, to transmit. For example, the color filter 180 can transmit the red light and the blue light, except for the green light. Accordingly, the color filter 180 may include a red color filter 182 and a blue color filter 184 which are alternatively disposed. Specifically, the red color filter 182 may be formed on one pixel, and the blue color filter 184 may be formed on another pixel adjacent to the one pixel. The red light transmitting through the red color filter 182 is incident on the first photoelectric conversion portion 130 via the light transmission portion 170, and the first photoelectric conversion portion 130 converts the red light into the electric charge in accordance with the quantity of the light. Similarly, the blue light transmitting through the blue color filter 184 is incident on the first photoelectric conversion portion 130 via the light transmission portion 170, and the first photoelectric conversion portion 130 converts the blue light into the electric charge in accordance with the quantity of the light. Meanwhile, the color filter 180 is not limited to the red and blue color filters 182 and 184, but can transmit a light of cyan and/or magenta wavelength.

The organic light receiving portion 190 is formed on the color filter 180. Specifically, the organic light receiving portion 190 is formed on the entire upper portion including the plurality of color filters 180. The organic light receiving portion 190 is formed by layering a first transparent electrode 192, an organic layer 194, and a second transparent electrode 196. The organic layer 194 absorbs the light of the first wavelength, for example, the green light, to generate the electric charge corresponding to the quantity of the light. To this end, the organic layer 194 contains green dye, and may container, for example, rhodamine dye, phthalocyanines, quinacridon, eosin, and merocyanine dye. The organic layer 194 absorbs the green light to generate exciton, and the exciton is separated into electrons and holes by a power applied to the organic layer 194 via the first transparent electrode 192 and the second transparent electrode 196. Specifically, a positive voltage is applied to the first transparent electrode 192, and a negative voltage is applied to the second transparent electrode 196, so that the exciton generated by the organic layer 194 is separated into the electrons and the holes. The first and second transparent electrodes 192 and 196 may be made of a conductive transparent substance so that the light easily transmits the electrodes, and may be made of, for example, ITO, IZO, ZnO, roux, TiOx, or IrOx. Meanwhile, a contact 198 is formed in a predetermined region of the color filter 180 and the dielectric layer 160 to connect the first transparent electrode 192 and the charge storing portion 140. Specifically, the contact 198 is formed by forming a contact hole in the predetermined region of the color filter 180 and the dielectric layer 160 to expose the charge storing portion 140, and filling the contact hole with a conductive substance, such as metal. Accordingly, the first transparent electrode 192, the organic layer 194 and the second transparent electrode 196 which are connected to each other via the charge storing portion 140 and the contact 198 constitute the second photoelectric conversion portion 200.

A lens (not illustrated) may be formed on the organic light receiving portion 190, and the lens may be formed for every each pixel 100. The lens may be made of an organic substance, such as photosensitive resin, or an inorganic substance. In order to make the lens using the inorganic substance, for example, an organic substance pattern is formed on the second transparent electrode 196, and then is subjected to a thermal process to form the lens. The organic substance pattern is changed in a lens shape by the thermal process. Further, a protective film (not illustrated) may be formed on the lens. The protective film may be made of inorganic oxide. For example, the protective film may be formed by layering at least one of a silicon oxide film, a titanium oxide film, a zirconium oxide film ($ZrO_2$), and a hafnium oxide film ($HfO_2$). In particular, as the protective film, a low-temperature oxide film which is a kind of silicon oxide film may be used. Since the low-temperature oxide film is formed at a low temperature of about 100 to 200° C., it is possible to reduce damage of lower structures due to the heat. In addition, the low-temperature oxide film is amorphous, it is possible to reduce reflection, refraction, and scattering of the incident light. The protective film serves to protect the lens against external shock in the case where the lens is made of the organic substance. In addition, a slight space exists between the adjacent lenses, and the protective film serves to fill the space. If the space between the adjacent lenses is filled, a light focusing performance of the incident light can be improved. The reason is that the reflection, the refraction and the scattering of the incident light reaching the space between the adjacent lenses can be decreased.

As described above, the image sensor according to the embodiment of the present invention includes the first photoelectric conversion portion 100A for absorbing plural lights, except for the green light, through the color filter 180 to generate the electric charge, and the second photoelectric conversion portion 200 for absorbing the green light to generate the electric charge which are spaced apart from each other in a vertical direction. Specifically, according to the second photoelectric conversion portion 200, the organic light receiving portion 190 absorbing the green light and generating the electric charge is formed on the color filter 180, and the charge storing portion 140 storing the electric charge generated by the organic light receiving portion 190 is formed in the substrate 110 to be spaced apart from the first photoelectric conversion portion 100A formed by the photodiode or the like.

Since a portion of the second photoelectric conversion portion 200, i.e., the organic light receiving portion 190, is formed to be vertically spaced apart from the first photoelectric conversion portion 100A, the number of the pixels can be increased in the same area, as compared with the related art in which the photoelectric conversion portion absorbing the red, green and blue light incident thereon through the color filter 180 to generate the electric charge is formed in the substrate 110. Therefore, a degree of integration can be improved. For example, the related art is required for four pixels, that is, two pixels for the green light, one pixel for the red light, and one pixel for the blue light, for unit area to achieve the green, the red and the blue, but the present invention is required for two pixels to achieve these colors. Therefore, it is possible to increase an area margin of about 100%.

Further, in the related art, a size of the pixel is decreased to increase the degree of integration, and thus an interval between the wiring layers is also narrowed, so that crosstalk occurs. However, since the present invention has the area margin of about 100%, as compared with the related art, it is possible to secure the interval between the wiring layers, so that the crosstalk does not occur.

Figure 4:
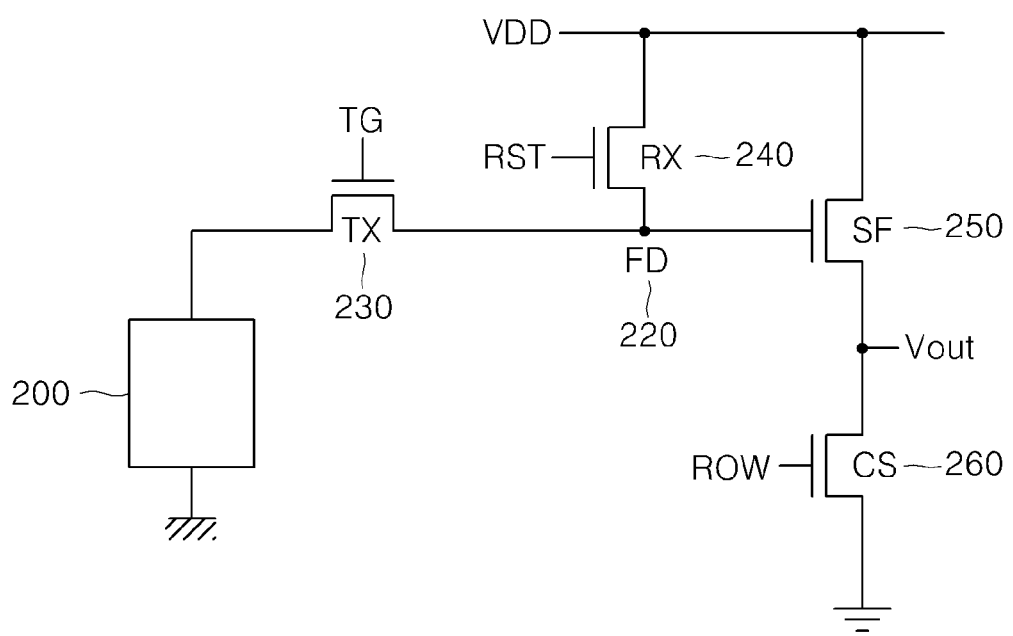
FIG. 4 is an equivalent circuit diagram of the image sensor according to the embodiment of the present invention.

FIG. 4 is an equivalent circuit diagram of the image sensor according to the embodiment of the present invention, and, in particular, is an equivalent circuit diagram of the second photoelectric conversion portion. As illustrated in FIG. 4, the image sensor includes the second photoelectric conversion portion 200, a charge detecting portion 220, a charge transfer element 230, a reset element 240, an amplifying element 250, and a selection element 260. The charge detecting portion 220, the charge transfer element 230, the reset element 240, the amplifying element 250, and the selection element 260 are read-out elements.

The second photoelectric conversion portion 200 absorbs the light of the first wavelength, for example, the green light, to generate and store the electric charge in accordance with the quantity of the light. The second photoelectric conversion portion 200 includes the first transparent electrode 192 absorbing the green light to generate the electric charge, the organic layer 194 and the second transparent electrode 196, the charge storing portion 140 storing the generated electric charge, and the contact 198 connecting the charge storing portion 140 and the first transparent electrode 192. Accordingly, the organic layer 194 absorbs the green light to generate the exciton, and the exciton is separated into electrons and holes by a potential difference between the first and second transparent electrodes 192 and 194. The electrons are stored in the charge storing portion 140 via the contact 198. The charge detecting portion 220 usually uses the floating diffusion region, and receives the electric charge stored in the second photoelectric conversion portion 210. Since the charge detecting portion 220 has parasitic capacitance, the electric charges are accumulatively stored. The charge detecting portion 220 is electrically connected to a gate of the amplifying element 250 to control the amplifying element 250.

The charge transfer element 230 transfers the electric charge to the charge detecting portion 220 from the second photoelectric conversion portion 210. The charge transfer element 230 is generally made of one transistor, and is controlled by a charge transfer signal TG. In particular, the charge transfer element 230 preferably transfers the electric charge stored in the second photoelectric conversion portion 210 to the charge detecting portion 220. Specifically, the electric charge staying in the second photoelectric conversion portion 210 appears as an afterimage at next read-out operation, which becomes a cause of reduction in conversion gain and a cause of reduction in charge storage capacity of the second photoelectric conversion portion 210. Accordingly, a native transistor having a threshold voltage Vth which is close to zero is preferably used as the charge transfer element 230.

The reset element 240 periodically resets the charge detecting portion 220. A source of the reset source 240 is connected to the charge detecting portion 220, and a drain is connected to a terminal of a power voltage Vdd. Further, the reset element 240 is driven in response to a reset signal REST. The native transistor having the threshold voltage Vth which is close to zero is also preferably used as the reset element 240.

The amplifying element 250 serves as a source follower, and outputs a voltage which is changed in response to a potential of the charge detecting portion 220, to an output line Vout. The amplifying element 250 has a source connected to a drain of the selection element 260, and a drain connected to the terminal of the power voltage Vdd.

The selection element 260 functions to select the unit pixel to be read in unit of column, and is driven in response to a selection signal ROW. A drain of the selection element 260 is connected to the output line.

A method of operating the image sensor according to an embodiment of the present invention will now be described by taking a case of sensing the second photoelectric conversion portion 200 for an example with reference to the equivalent circuit diagram of FIG. 4 and the cross-sectional view of FIG. 3.

First, the reset element 240 and the charge transfer element 220 are turned on to apply the power voltage Vdd to the second photoelectric conversion portion 200. In this instance, as illustrated in FIG. 3, the power voltage Vdd is applied to the first transparent electrode 192 via the charge storing portion 140 and the contact 198. At that time, a ground voltage is applied to the second transparent electrode 196 opposite to the first transparent electrode 192. If the power voltage Vdd is applied to the first transparent electrode 192 and the ground voltage is applied to the second transparent electrode 196, the exciton generated when the organic layer 194 receives the light can be separated into the electrons and the holes.

Subsequently, the charge transfer element 220 is turned off, and the reset element 240 is turned on. Accordingly, the power voltage Vdd is supplied to the charge detecting portion 220 to reset the charge detecting portion 220. Since the charge detecting portion 220 is reset by the supply of the power voltage, the electric charge staying in the charge detecting portion 220 can be eliminated. Specifically, the electric charge generated at the previous cycle can stay in the charge detecting portion 220. In this instance, the electric charge of the previous cycle staying in the charge detecting portion 220 is added to the electric charge of a current cycle to increase the potential of the charge detecting portion 220, and a voltage higher than the potential of the current cycle is sensed, so that there is possibly a problem in that original color cannot be realized. Accordingly, the charge detecting portion 220 is reset by applying the power voltage Vdd thereto in order to eliminate the electric charge of the previous cycle staying in the charge detecting portion 220. Further, the first transparent electrode 192 is floated by turning the charge transfer element 220 off, and thus the first transparent electrode 192 maintains the potential of the power voltage Vdd. As the first transparent electrode 192 maintains the potential of the power voltage Vdd and the second transparent electrode 196 maintains the potential of the ground voltage, the organic layer 194 receives the green light, so that the exciton is separated into the electrons and the holes. The electric charge generated by the organic layer 194 is stored in the charge storing portion 140.

Subsequently, the reset element 240 is turned off, and the charge transfer element 230 is turned on. The electrons generated by separation of the exciton in the organic layer 194 and stored in the charge storing portion 140 move to the charge detecting portion 220, and thus the potential of the charge detecting portion 220 is lowered. As the potential of the charge detecting portion 220 is lowered, the potential of the output line Vout to be output via the sensing element 250 is also lowered.

And, the reset element 240 and the charge transfer element 230 are turned off. In this way, the charge detecting portion 220 maintains the potential transferred via the charge transfer element 230, and thus a constant current flows in the gate of the sensing element 250, so that the output line Vout is constantly maintained thereby to read the voltage.

The operating method has been described only as an example of sensing the electric charge of the second photoelectric conversion portion. However, the case of sensing the electric charge of the first photoelectric conversion portion is identical to the case of the sensing the electric charge of the second photoelectric conversion portion, except for the case where the power voltage Vdd is applied to the second photoelectric conversion portion, and its description will be omitted herein. That is, similar to the equivalent circuit illustrated in FIG. 4, the electric charge stored in the first photoelectric conversion portion is sensed using the read-out element including the charge detecting portion, the charge transfer element, the reset element, the amplifying element, and the selection element. Accordingly, the method of operating the first photoelectric conversion portion is identical to the above-mentioned operating method, except for the case where the charge transfer element and the reset element are turned on to apply the power voltage Vdd to the second photoelectric conversion portion.

The present invention has been described in detail with reference to the foregoing embodiments and the accompanying drawings. However, the present invention should not be limited to these embodiments, and the present invention is limited to only the following claims. It is to be understood by one with ordinary skill in the art that various modifications may be made to the present invention without departing from the technical spirit and the scopes of the claims.

DESCRIPTION OF REFERENCE NUMBERS

| | |
|---|---|
| 100: pixel | 100A: first photoelectric conversion portion |
| 100B: read-out portion | 200: second photoelectric conversion portion |
| 110: substrate | 120: element isolation region |
| 130: first photoelectric conversion portion | |
| 140: charge storing portion | 150: read-out element |
| 160: dielectric layer | 170: light transmission portion |
| 180: color filter | 190: organic light receiving portion |

The invention claimed is:

1. An image sensor comprising:
a first photoelectric conversion portion configured to receive plural lights, except for a light of first wavelength, to generate an electric charge;
a second photoelectric conversion portion configured to receive the light of the first wavelength to generate an electric charge;
a plurality of first read-out elements reading an electric charge generated by the first photoelectric conversion portion; and
a plurality of second read-out elements reading an electric charge generated by the second photoelectric conversion portion,
wherein at least a portion of the first photoelectric conversion portion and the second photoelectric conversion portion is spaced apart from each other in a vertical direction,
wherein the first photoelectric conversion portion is provided in a predetermined region in a substrate.

2. The image sensor of claim 1, wherein the plurality of first read-out elements are spaced apart from the first photoelectric conversion portion and provided on the substrate.

3. The image sensor of claim 2, further comprising a light transmission portion formed on the first photoelectric conversion portion;
a dielectric layer formed on the plurality of first read-out elements; and
a color filter formed on the light transmission portion and the dielectric layer.

4. The image sensor of claim 3, wherein the color filter is configured so that at least two color filters each receiving light of different wavelength are alternatively disposed.

5. The image sensor of claim 4, wherein the second photoelectric conversion portion includes a charge storing portion provided in the substrate, spaced apart from the first photoelectric conversion portion and the plurality of first read-out elements at a predetermined interval;
an organic light receiving portion formed on the color filter spaced apart from the charge storing portion in the vertical direction; and
a contact formed between the charge storing portion and the organic light receiving portion to connect the charge storing portion and the organic light receiving portion.

6. The image sensor of claim 5, wherein the plurality of second read-out elements are spaced a predetermined distance from the charge storing portion and provided on the substrate.

7. The image sensor of claim 6, wherein the dielectric layer and the color filter are provided between the organic light receiving portion and the substrate provided with the charge storing portion and the second read-out elements, and the contact is formed in the predetermined region of the color filter and the dielectric layer.

8. The image sensor of claim 7, wherein the organic light receiving portion is formed by layering a first transparent electrode, an organic layer, and a second transparent electrode.

9. The image sensor of claim 8, wherein the organic light receiving portion receives the light of the first wavelength to generate an electric charge, and the charge storing portion stores the electric charge via the contact.

10. An image sensor comprising:
a plurality of pixels each provided with a first photoelectric conversion portion receiving light, except for light of first wavelength, to generate an electric charge, and a first read-out element reading the electric charge; and
a second photoelectric conversion portion configured to receive the light of the first wavelength to generate an electric charge,
wherein the first photoelectric conversion portion is provided in a predetermined region in a substrate,
wherein the second photoelectric conversion portion includes a charge storing portion provided between at least two pixels, a plurality of second read-out elements spaced apart from the charge storing portion to read the electric charge, an organic light receiving portion connected to the charge storing portion and provided on an entire upper portion thereof including the plurality of pixels, and a contact configured to connect the charge storing portion to the organic light receiving portion.

11. The image sensor of claim 10, wherein the pixel includes a substrate provided with the first photoelectric conversion portion and the plurality of first read-out elements spaced apart from the first photoelectric conversion portion;
a light transmission portion formed on the first photoelectric conversion portion;
a dielectric layer formed on the first read-out element between the light transmission portions; and
a color filter formed on the light transmission portion and the dielectric layer.

12. The image sensor of claim 11, wherein the charge storing portion is spaced apart from the first photoelectric conversion portion and provided in the substrate, the plurality of second read-out elements are spaced apart from the charge storing portion and provided on the substrate, the contact is provided in the dielectric layer and the color filter, which are laminated on the substrate, and the organic light receiving portion is provided on the color filter and connected to the contact.

13. The image sensor of claim 12, wherein the organic light receiving portion includes a first transparent electrode, an organic layer, and a second transparent electrode, which are layered on the color filter.

14. The image sensor of claim 13, wherein the first transparent electrode is applied by a voltage of higher potential than that applied to the second transparent electrode, so that exciton generated by the organic layer is separated into an electron and a hole.

15. A method of operating an image sensor comprising the steps of:
applying a voltage of first potential to a first transparent electrode of a second photoelectric conversion portion, and applying a voltage of second potential lower than the first potential to a second transparent electrode;
floating the first transparent electrode so that the first transparent electrode maintains the first potential;
receiving a light of a first wavelength to generate an electric charge and store it in a charge storing portion;
transferring the electric charge stored in the charge storing portion to a charge detecting portion; and
sensing a potential of the charge detecting portion.

16. The method of operating the image sensor of claim 15, further comprising resetting the charge detecting portion before the electric charge stored in the charge storing portion is transferred to the charge detecting portion.

* * * * *